(12) United States Patent
Lee

(10) Patent No.: US 12,713,725 B2
(45) Date of Patent: Aug. 18, 2026

(54) IMAGE SENSING DEVICE

(71) Applicant: SK hynix Inc., Icheon-si (KR)

(72) Inventor: Eun Khwang Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 845 days.

(21) Appl. No.: 17/899,267

(22) Filed: Aug. 30, 2022

(65) Prior Publication Data

US 2023/0075346 A1 Mar. 9, 2023

(30) Foreign Application Priority Data

Sep. 3, 2021 (KR) ........................ 10-2021-0117810

(51) Int. Cl.
*H10F 39/00* (2025.01)

(52) U.S. Cl.
CPC ..... *H10F 39/8063* (2025.01); *H10F 39/8053* (2025.01); *H10F 39/8067* (2025.01)

(58) Field of Classification Search
CPC ............. H01F 39/8063; H10F 39/8053; H10F 39/8067; H10F 39/802
See application file for complete search history.

(56) References Cited

U.S. PATENT DOCUMENTS 9,202,833 B2 12/2015 Mackey
11,646,336 B2 * 5/2023 Seo ..................... H10F 39/8063 257/432
11,676,982 B2 * 6/2023 Lim ...................... H10F 39/807 257/432
2006/0043515 A1 * 3/2006 Ford ................... H10F 39/8063 438/69
2015/0054103 A1 2/2015 Mackey
2017/0077163 A1 * 3/2017 Chou ................... H04N 23/672
2017/0338265 A1 * 11/2017 Yoshiba .............. H10F 39/8057
2019/0267420 A1 * 8/2019 Lee ..................... H10F 39/8063
(Continued)

FOREIGN PATENT DOCUMENTS

CN 112992941 A 6/2021
CN 113224085 A 8/2021
KR 20110079338 A 7/2011

OTHER PUBLICATIONS

First Office Action for CN Appl. No. 202211044827.3, mailed on Apr. 22, 2026, 14 pages with English translation.

*Primary Examiner* — Jennifer D. Carruth
(74) *Attorney, Agent, or Firm* — Ashurst Perkins Coie US LLP

(57) ABSTRACT

An image sensing device includes a lens module to converge incident light from a scene; and a pixel array located relative to the lens module to receive the converged incident light from the lens module and structured to include a plurality of pixels, each of which is structured to detect the converged incident light carrying image information of the scene, wherein the plurality of pixels in the pixel array includes a first pixel in an edge region of the pixel array, the edge region being spaced apart from an optical axis of the lens module by a predetermined distance, and wherein the first pixel includes: a semiconductor region including a photo-electric conversion element configured to generate photocharge corresponding to an intensity of the incident light detected at the first pixel; a microlens disposed over the semiconductor region; and a reflective structure disposed to cover a portion of the first pixel.

19 Claims, 11 Drawing Sheets

(56) References Cited

U.S. PATENT DOCUMENTS

2020/0075658 A1* 3/2020 Kato ................... H10F 39/8067
2021/0057475 A1* 2/2021 Yamazaki ........... H10F 39/8053
2021/0104568 A1* 4/2021 Hsieh ................. G01N 21/6486
2021/0280625 A1* 9/2021 Park ...................... H10F 39/024
2022/0181371 A1* 6/2022 Byun .................. H10F 39/8053

* cited by examiner

IMAGE SENSING DEVICE

CROSS-REFERENCE TO RELATED APPLICATION

This patent document claims the priority and benefits of Korean patent application No. 10-2021-0117810, filed on Sep. 3, 2021, the disclosure of which is incorporated herein by reference in its entirety as part of the disclosure of this patent document.

TECHNICAL FIELD

The technology and implementations disclosed in this patent document generally relate to an image sensing device that includes imaging pixels structured to detect incident light and generate electrical signals corresponding to the intensity of the incident light.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device having improved light reception (Rx) efficiency.

In an embodiment of the disclosed technology, an image sensing device may include a lens module structured to converge incident light from a scene; and a pixel array located relative to the lens module to receive the converged incident light from the lens module and structured to include a plurality of pixels, each of which is structured to detect the converged incident light carrying image information of the scene, wherein the plurality of pixels in the pixel array includes a first pixel in an edge region of the pixel array, the edge region being spaced apart from an optical axis of the lens module by a predetermined distance, and wherein the first pixel includes: a semiconductor region including a photoelectric conversion element configured to generate photocharge corresponding to an intensity of the incident light detected at the first pixel; a microlens disposed over the semiconductor region; and a reflective structure disposed to cover a portion of the first pixel.

In another embodiment of the disclosed technology, an image sensing device may include a semiconductor region including a photoelectric conversion element structured to generate photocharges corresponding to an intensity of incident light; a microlens disposed over the semiconductor region to direct incident light to the semiconductor region; and a reflective structure disposed to cover a portion of the microlens.

In another embodiment of the disclosed technology, an image sensing device may include a lens module configured to converge incident light received from a scene; and a pixel array including a plurality of pixels, each of which senses the incident light received from the lens module. The pixel array may include an edge region that is spaced apart from an optical axis of the lens module by a predetermined distance. A pixel included in the edge region may include a semiconductor region including a photoelectric conversion element configured to generate photocharges corresponding to intensity of the incident light, a microlens disposed over the semiconductor region, and a reflective structure disposed to cover at least a portion of the microlens.

In another embodiment of the disclosed technology, an image sensing device may include a semiconductor region including a photoelectric conversion element configured to generate photocharges corresponding to intensity of incident light, a microlens disposed over the semiconductor region, and a reflective structure disposed to cover at least a portion of the microlens.

In another embodiment of the disclosed technology, an image sensing device may include a lens module structured to converge incident light from a scene and to produce an output light beam carrying image information; and a pixel array located relative to the lens module to receive the output light beam from the lens module and structured to include a plurality of pixels, each of which is structured to detect light of the output light beam from the lens module to generate electrical signals carrying the image information of the scene, wherein the plurality of pixels in the pixel array includes an edge pixel in an edge region of the pixel array that is spaced apart from an optical axis of the lens module by a predetermined distance, and wherein the edge pixel includes: a semiconductor region including a photoelectric conversion element configured to generate photocharge corresponding to an intensity of the incident light detected at the first pixel; a microlens disposed over the semiconductor region; and a reflective structure disposed to cover a portion of the edge pixel to reflect incident light at the location of the reflective structure away from the edge pixel while exposing another portion of the edge pixel to the incident light to receive the incident light.

In another embodiment of the disclosed technology, an image sensing device may include a semiconductor region including a photoelectric conversion element structured to generate photocharges corresponding to an intensity of incident light; a microlens disposed over the semiconductor region to direct incident light to the semiconductor region; and a reflective structure disposed to cover a portion of the microlens to reflect light away from the semiconductor region while exposing another portion of the microlens to receive light and to direct the received light to the semiconductor region.

It is to be understood that both the foregoing general description and the following detailed description of the disclosed technology are illustrative and explanatory and are intended to provide further explanation of the disclosure as claimed.

DETAILED DESCRIPTION

Figure 1:
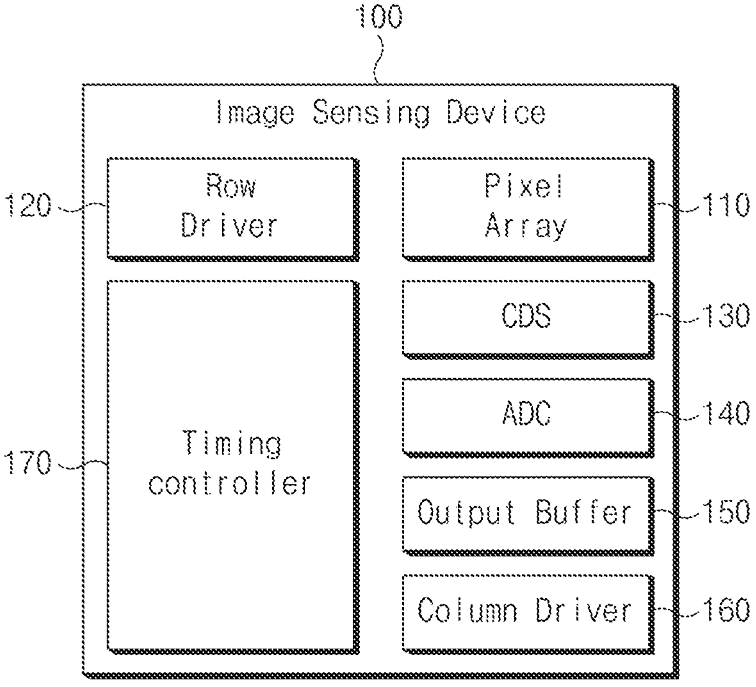
FIG. 1 is a block diagram illustrating an example of an image sensing device based on some implementations of the disclosed technology.

This patent document provides implementations and examples of an image sensing device including image sensing pixels that can generate electrical signals corresponding to the intensity of incident light that may be used to substantially address one or more technical or engineering issues and mitigate limitations or disadvantages encountered in some other image sensing devices. Some implementations of the disclosed technology relate to the image sensing device having improved light reception (Rx) efficiency. The disclosed technology provides various implementations of an image sensing device that can improve light reception (Rx) efficiency of pixels and reduce crosstalk between pixels.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

FIG. 1 is a block diagram illustrating an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row decoder 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
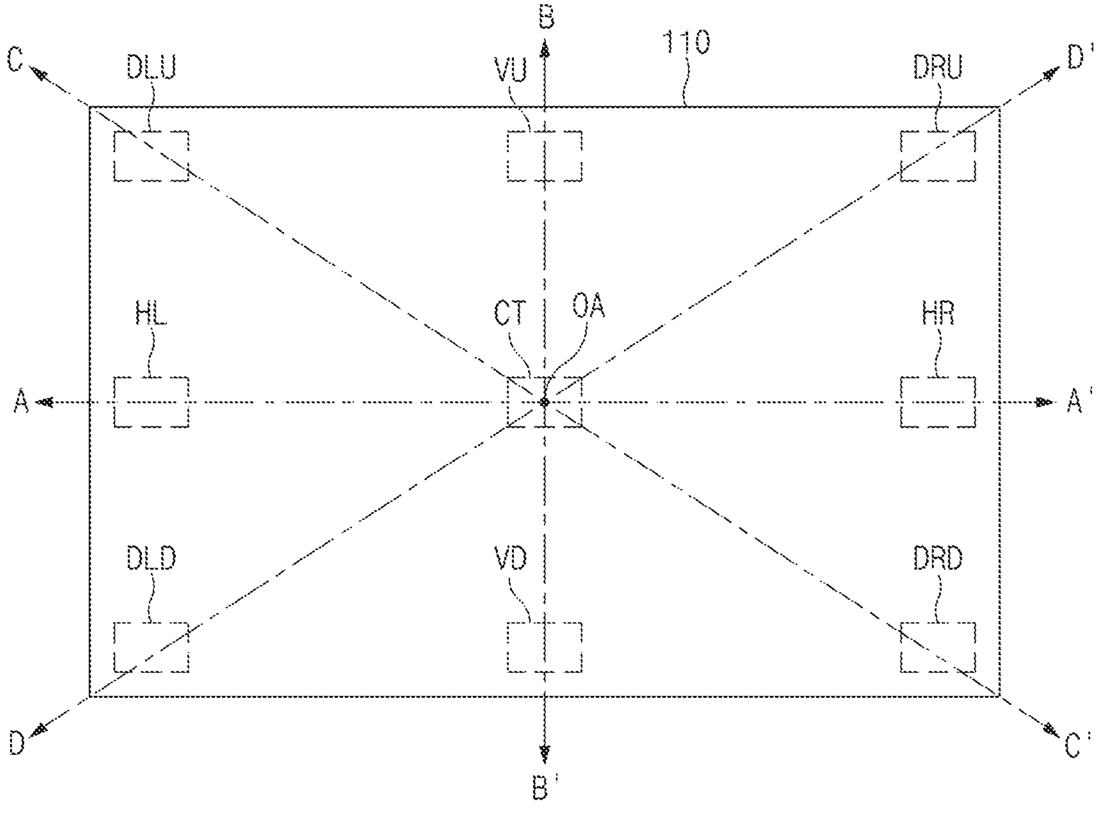
FIG. 2 is a schematic diagram illustrating an example of a pixel array shown in FIG. 1.

FIG. 2 is a schematic diagram illustrating an example of the pixel array 110 shown in FIG. 1.

Referring to FIG. 2, the pixel array 110 may include a plurality of pixels arranged in a matrix array including a plurality of rows and a plurality of columns. The pixel array 110 may be divided into a plurality of regions based on relative positions of pixels included therein.

The pixel array 110 may include a center region CT, a first horizontal edge region HL, a second horizontal edge region HR, a first vertical edge region VU, a second vertical edge region VD, and first to fourth diagonal edge regions DLU, DRD, DLD, and DRU. Each region included in the pixel array 110 may include an certain number of pixels.

The first horizontal edge region HL, the second horizontal edge region HR, the first vertical edge region VU, the second vertical edge region VD, and the first to fourth diagonal edge regions DLU, DRD, DLD, and DRU may be collectively referred to as an edge region, and the edge region may be a region spaced apart from the optical axis OA by a predetermined distance.

The center region CT may be located at the center of the pixel array 110. The light rays from a scene pass through the lens module (50 shown in FIGS. 3A and 3B) and are transmitted to the pixel array 110, and an optical axis of the lens module passes through the center region CT.

The first horizontal edge region HL and the second horizontal edge region HR may be located at the edge regions of the pixel array 110 in a horizontal direction passing through the center region CT (e.g., a hypothetical horizontal line A-A' passing through the center region CT as shown in FIG. 2). In some implementations, each of the edge regions of the pixel array 110 may include a plurality of pixels located within a predetermined distance from the outermost pixel of the pixel array 110.

The first vertical edge region VU and the second vertical edge region VD may be disposed at the edge regions of the pixel array 110 in the vertical direction passing through the center region CT (e.g., a hypothetical vertical line B-B' passing through the center region CT as shown in FIG. 2).

The first diagonal edge region DLU may be disposed at the edge of the pixel array 110 in a diagonal direction from the center region CT (e.g., a hypothetical diagonal line C-OA passing through the center region CT as shown in FIG. 2).

The second diagonal edge region DRD may be disposed at the edge of the pixel array 110 in a diagonal direction from the center region CT (e.g., a hypothetical diagonal line OA-C' passing through the center region CT as shown in FIG. 2).

The third diagonal edge region DLD may be disposed at the edge of the pixel array 110 in a diagonal direction from the center region CT (e.g., a hypothetical diagonal line D-OA passing through the center region CT as shown in FIG. 2).

The fourth diagonal edge region DRU may be disposed at the edge of the pixel array 110 in a diagonal direction from the center region CT (e.g., a hypothetical diagonal line OA-D' passing through the center region CT as shown in FIG. 2).

Figure 3A:
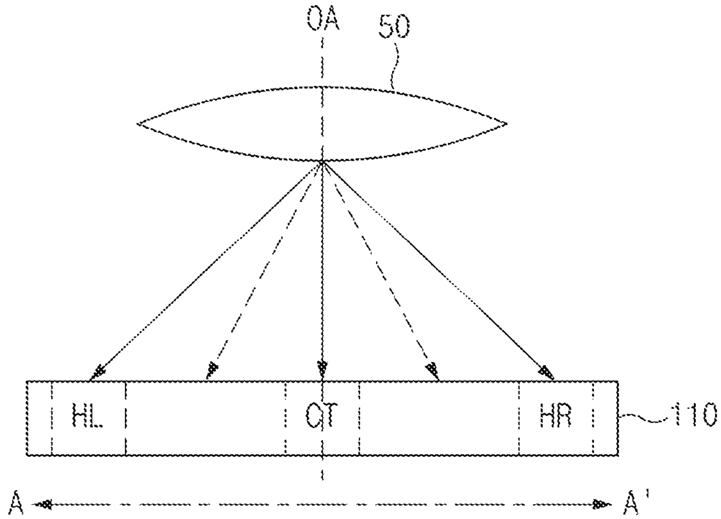
FIG. 3A is a diagram illustrating examples of light rays incident upon the pixel array shown in FIG. 2.

FIG. 3A is a diagram illustrating examples of light rays incident upon the pixel array 110 shown in FIG. 2.

Referring to FIG. 3A, the image sensing device 100 shown in FIG. 1 may further include a lens module 50. The lens module 50 may be disposed between a scene to be captured and the pixel array 110 in a forward direction from the image sensing device 100. The lens module 50 may collect light reflected from the scene, and may allow the collected light to be focused onto pixels of the pixel array 110. The lens module 50 may include one or more lenses that are arranged to be focused upon an optical axis OA. In this case, the optical axis OA may pass through the center region CT of the pixel array 110.

A chief ray having passed through the lens module 50 may be directed from the optical axis OA to each of the regions of the pixel array 110. In FIG. 2, the chief ray for the first horizontal edge region HL may be directed in the left direction from the center region CT, the chief ray for the first vertical edge region VU may be directed upward from the center region CT, and the chief ray for the second vertical edge region VD may be directed downward from the center region CT. On the other hand, the chief ray for the first diagonal edge region DLU may be directed in a diagonal direction (e.g., left-upper direction) from the center region CT, the chief ray for the second diagonal edge region DRD may be directed in a diagonal direction (e.g., right-lower direction) from the center region CT, the chief ray for the third diagonal edge region DLD may be directed in a diagonal direction (e.g., left-lower direction) from the center region CT, and the chief ray for the fourth diagonal edge region DRU may be directed in a diagonal direction (e.g., right-upper direction) from the center region CT.

FIG. 3A is a cross-sectional view illustrating an example of the pixel array 110 taken along the first cutting line A-A' shown in FIG. 2. Accordingly, the center region CT may be disposed at the center of the pixel array 110, the first horizontal edge region HL may be disposed at a left side of the center region CT, and the second horizontal edge region HR may be disposed at a right side of the center region CT.

The chief ray incident upon the center region CT may be vertically incident upon a top surface of the pixel array 110. Thus, an incident angle (an angle of incidence) of the chief ray incident upon the center region CT may be set to 0° (or an angle close to) 0°.

However, a chief ray incident upon the first horizontal edge region HL and a chief ray incident upon the second horizontal edge region HR may be obliquely incident upon the top surface of the pixel array 110. Thus, an incident angle of the chief ray incident upon the first horizontal edge region HL may correspond to a predetermined angle (e.g., an angle greater than 0° and less than 90°), and an incident angle of the chief ray incident upon the second horizontal edge region HR may correspond to a predetermined angle (e.g., an angle greater than 0° and less than 90°). In this case, the predetermined angle may vary depending on the size of the pixel array 110, a curvature of the lens module 50, and the distance between the lens module 50 and the pixel array 110.

The chief ray incident upon a region between the center region CT and the first horizontal edge region HL may be obliquely incident upon the top surface of the pixel array 110 as shown in the left dotted line of FIG. 3A, but the incident angle of the chief ray incident upon a region between the center region CT and the first horizontal edge region HL may be smaller than the incident angle of the chief ray incident upon the first horizontal edge region HL.

The chief ray incident upon a region between the center region CT and the second horizontal edge region HR may be obliquely incident upon the top surface of the pixel array 110 as shown in the right dotted line of FIG. 3A, but the incident angle of the chief ray incident upon a region between the center region CT and the second horizontal edge region HR may be smaller than the incident angle of the chief ray incident upon the second horizontal edge region HR.

Although FIG. 3A illustrates a cross-sectional view of the pixel array 110 taken along the first cutting line A-A' for convenience of description, the structural feature discussed with reference to FIG. 3A can be applied to the remaining regions of the pixel array 110 taken along the second cutting line B-B' in which the first horizontal edge region HL of FIG. 3A is replaced with the first vertical edge region VU and the second horizontal edge region HR of FIG. 3A is replaced with the second vertical edge region VD.

Figure 3B:
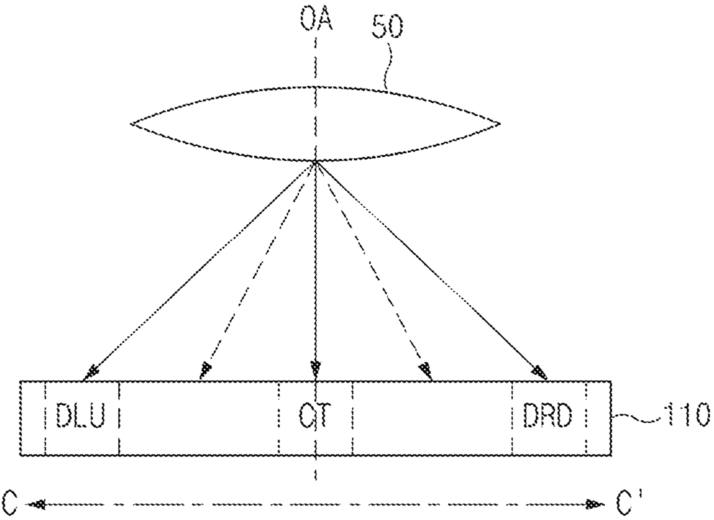
FIG. 3B is a diagram illustrating examples of light rays incident upon the pixel array shown in FIG. 2.

FIG. 3B is a diagram illustrating examples of light rays incident upon the pixel array 110 shown in FIG. 2.

In more detail, FIG. 3B is a cross-sectional view illustrating an example of the pixel array 110 taken along the third cutting line C-C'. Accordingly, the center region CT may be disposed at the center of the pixel array 110, the first diagonal edge region DLU may be disposed at a left side of the center region CT, and the second diagonal edge region DRD may be disposed at a right side of the center region CT.

The chief ray incident upon the center region CT may be vertically incident upon a top surface of the pixel array 110. Thus, an incident angle of the chief ray incident upon the center region CT may be set to 0° (or an angle close to) 0°.

However, a chief ray incident upon the first diagonal edge region DLU and a chief ray incident upon the second diagonal edge region DRD may be obliquely incident upon the top surface of the pixel array 110. Thus, an incident angle of the chief ray incident upon the first diagonal edge region DLU may correspond to a predetermined angle (e.g., an angle greater than 0° and less than) 90°, and an incident angle of the chief ray incident upon the second diagonal edge region DRD may correspond to a predetermined angle (e.g., an angle greater than 0° and less than 90°). In this case, the predetermined angle may vary depending on the size of the pixel array 110, a curvature of the lens module 50, and the distance between the lens module 50 and the pixel array 110.

The chief ray incident upon a region between the center region CT and the first diagonal edge region DLU may be obliquely incident upon the top surface of the pixel array 110 as shown in the left dotted line of FIG. 3B, but the incident angle of the chief ray incident upon a region between the center region CT and the first diagonal edge region DLU may be smaller than the incident angle of the chief ray incident upon the first diagonal edge region DLU.

The chief ray incident upon a region between the center region CT and the second diagonal edge region DRD may be obliquely incident upon the top surface of the pixel array 110 as shown in the right dotted line of FIG. 3B, but the incident angle of the chief ray incident upon a region between the center region CT and the second diagonal edge region DRD may be smaller than the incident angle of the chief ray incident upon the second diagonal edge region DRD.

Although FIG. 3B illustrates a cross-sectional view of the pixel array 110 taken along the third cutting line C-C' for convenience of description, the structural feature discussed with reference to FIG. 3B can be applied to the remaining regions of the pixel array 110 taken along the fourth cutting line D-D' in which the first diagonal edge region DLU of FIG. 3B is replaced with the third diagonal edge region DLD and the second diagonal edge region DRD of FIG. 3B is replaced with the fourth diagonal edge region DRU.

Figure 4:
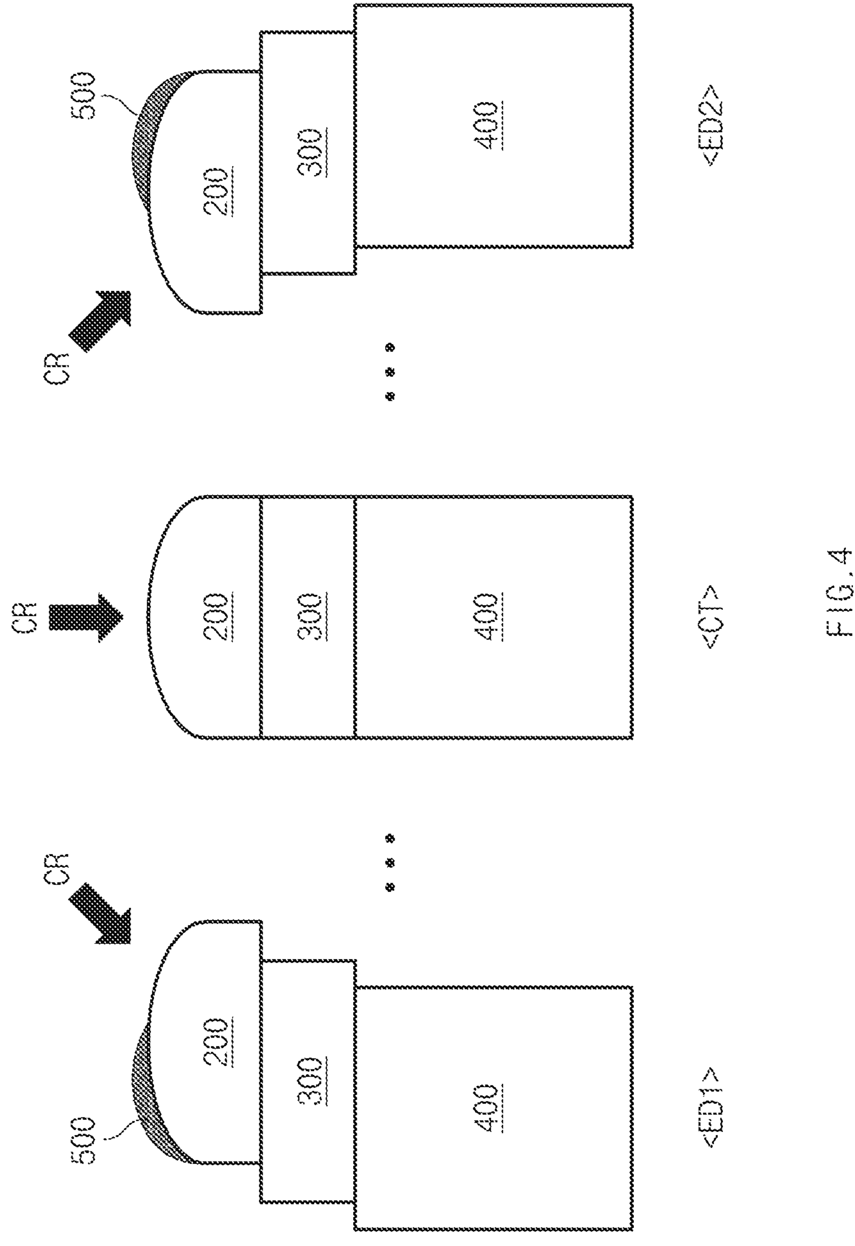
FIG. 4 is a diagram illustrating example structures of pixels varying depending on the position of each pixel.

FIG. 4 is a diagram illustrating example structures of pixels varying depending on the position of each pixel.

FIG. 4 schematically illustrates a pixel disposed at the center region CT, a pixel disposed at the first edge region ED1, and a pixel disposed at the second edge region ED2.

The first edge region ED1 and the second edge region ED1 may correspond to: the first horizontal edge region HL and the second horizontal edge region HR; the vertical edge region VU and the second vertical edge region VD; the first diagonal edge region DLU and the second diagonal edge region DRD; or the third diagonal edge region DLD and the fourth diagonal edge region DRU.

Each of the pixels disposed at the center region CT, the pixel disposed at the first edge region ED1, and the pixel disposed at the second edge region ED2 may be formed by sequentially stacking a microlens 200, an optical filter 300, and a semiconductor region 400.

The microlens 200 may be formed over the optical filter 300, and may increase light gathering power of incident light, resulting in increased light reception (Rx) efficiency of the corresponding pixel.

The optical filter 300 may be formed over the semiconductor region 400. The optical filter 300 may selectively transmit a light signal (e.g., red light, green light, blue light, magenta light, yellow light, cyan light, or others) having a specific wavelength.

The semiconductor region 400 may refer to a portion of the corresponding pixel from among the semiconductor substrate in which the pixel array 110 is disposed. The semiconductor substrate may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate.

The semiconductor region 400 may include a photoelectric conversion element corresponding to the corresponding pixel. In this case, the photoelectric conversion element may generate and accumulate photocharges corresponding to the intensity of incident light. The photoelectric conversion region may be arranged to occupy as large a region as possible to increase a fill factor indicating light reception (Rx) efficiency. For example, the photoelectric conversion element may be implemented as a photodiode, a phototransistor, a photogate, a pinned photodiode or a combination thereof.

If the photoelectric conversion element is implemented as a photodiode, the photoelectric conversion element may be formed as an N-type doped region that is formed by implanting N-type ions into the semiconductor region 400. In some implementations, the photoelectric conversion element may be formed by stacking a plurality of doped regions. In this case, a lower doped region may be formed by implantation of P+ ions and N+ ions, and an upper doped region may be formed by implantation of N-ions.

Photocharges generated and accumulated in the photoelectric conversion element may be converted into a pixel signal through a readout circuit (e.g., a transfer transistor, a reset transistor, a source follower transistor, and a selection transistor for use in a 4-transistor (4T) pixel) included in the corresponding pixel.

Although FIG. 4 illustrates one pixel disposed at the center region CT, one pixel disposed at the first edge region ED1, and one pixel disposed at the second edge region ED2 for convenience of description, other implementations are also possible, and each pixel can be arranged adjacent to other pixels.

Although not shown in the drawings, a grid structure for preventing optical crosstalk between adjacent optical filters 300 may be disposed between the adjacent optical filters 300. For example, the grid structure may be a tungsten grid or an air grid, but is not limited thereto.

In addition, an isolation structure for preventing optical crosstalk between adjacent semiconductor regions 400 may be disposed between the adjacent semiconductor regions 400. For example, the isolation structure may be formed by filling a trench formed by a deep trench isolation (DTI) process with insulation materials, but is not limited thereto.

An incident angle of the chief ray CR in the center region CT of the pixel array 110 may be set to 0° (or an angle close to 0°), so that the chief ray CR can be vertically incident upon each pixel. However, since the incident angle of the chief ray CR in the edge region ED1 or ED2 of the pixel array 110 is set to a predetermined angle, the chief ray CR can be obliquely incident upon each pixel. As the chief ray CR is obliquely incident upon each pixel, light reception (Rx) efficiency of the corresponding pixel may decrease and optical crosstalk between adjacent pixels may increase.

Therefore, the optical filter 300 and the microlens 200 may be shifted in a direction from which the chief ray CR is incident with respect to the semiconductor region 400. In this case, the degree of shifting of the microlens 200 that is shifted from the semiconductor region 400 may be greater than the degree of shifting of the optical filter 300 that is shifted from the semiconductor region 400.

On the other hand, the incident angle of the chief ray CR may gradually increase in the direction from the center region CT to the edge region ED1 or ED2 of the pixel array 110. Therefore, as the incident angle of the chief ray CR gradually increases, the degree of shifting of the microlens 200 that is shifted from the semiconductor region 400 and the degree of shifting of the optical filter 300 that is shifted from the semiconductor region 400 may gradually increase in the direction from the center region CT to the edge region ED1 or ED2.

In addition, a refractive index of the microlens 200 may be lower than a refractive index of the optical filter 300, and a refractive index of the optical filter 300 may be lower than a refractive index of the semiconductor region 400.

In addition, each of pixels included in the edge region ED1 or ED2 of the pixel array 110 may further include a refractive structure 500 that covers a portion of the pixel to reflect light away from the pixel while exposes other portions of the pixel to allow light to enter the pixel for sensing.

The reflective structure 500 may be disposed to overlap with at least a portion of the microlens 200, or may be disposed to cover at least a portion of the microlens 200 while allowing other portions of pixel to be exposed to, and to receive, incident light. In certain implementations, the reflective structure 500 may be disposed over the microlens 200. In some implementations, an anti-reflection layer for reducing reflectivity of light incident upon the microlens 200 may be disposed over the microlens 200. The reflective structure 500 may be disposed over the anti-reflection layer, or may be disposed between the anti-reflection layer and the microlens 200.

The reflective structure 500 may be disposed to be spatially positioned or shifted away from the optical axis OA with respect to the center of the microlens 200 to block the incident light from reaching a part of the pixel in which the reflective structure 500 is located.

The reflective structure 500 may reflect a portion of light incident upon a pixel and reflect the light toward the outside of the pixel while allowing other portions of the incident light to enter the pixel. The reflective structure 500 may also reflect light that has entered the pixel but is reflected backwards back to the pixel, resulting in an increase in a light reception (Rx) efficiency of the pixel for the incident light that is not blocked by the reflective structure from entering the pixel. The reflective structure 500 may prevent light incident upon the pixel from entering adjacent pixels, thereby reducing optical crosstalk between adjacent pixels. In some implementations, the reflective structure 500 can be used to increase the light reception (Rx) efficiency as will be discussed below with reference to FIG. 5. In addition, the reflective structure 500 can be used to reduce optical crosstalk as will be discussed below with reference FIGS. 6 and 7.

In some implementations, one or more reflective structures 500 may be disposed to reduce the optical crosstalk as well as to increase the light reception (Rx) efficiency, and the reflective structure 500 may be disposed opposite to the optical axis OA arranged in the direction in which the chief ray CR is incident upon the pixel with respect to the center of the microlens 200.

The position of the reflective structure 500 and the length of the reflective structure 500 may vary depending on the position of each pixel including the reflective structure 500, the radius of curvature of the microlens 200, and others, as will be discussed below with reference to FIGS. 9 and 10.

The reflective structure 500 may include a material having a high reflectivity to reflect light away. For example, the reflective structure 500 may include at least one of silver (Ag) and aluminum (Al), but other reflective materials may also be used to construct the reflective structure 500.

The reflective structure 500 may be formed through a coating process for a predefined region (e.g., a region where a mask is not disposed), but is not limited thereto.

Figure 5:
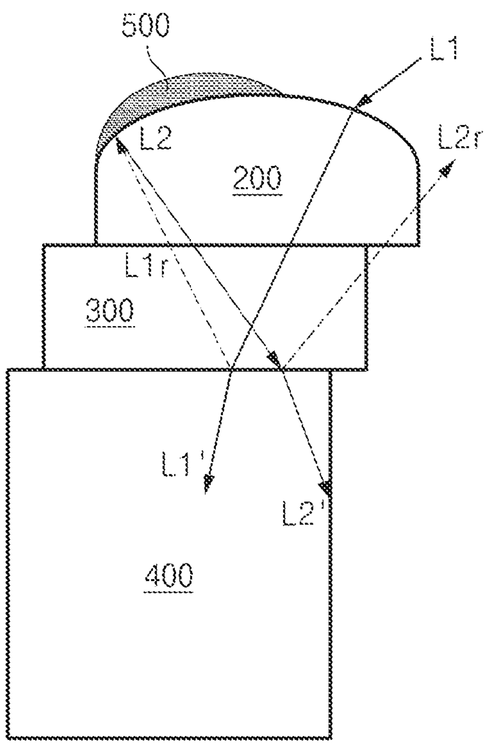
FIG. 5 is a diagram illustrating an example pixel structure that includes a reflective structure shown in FIG. 4 to increase light reception (Rx) efficiency.

FIG. 5 is a diagram illustrating an example pixel structure that includes the reflective structure 500 shown in FIG. 4 to increase light reception (Rx) efficiency.

In FIG. 5, a pixel included in the first edge region ED1 is illustrated, and it is assumed that a first incident light rays L1 corresponding to the chief ray CR is incident upon the pixel. Although the schematic diagram in FIG. 5 mainly illustrates the pixel included in the first edge region ED1 for convenience of description, it should be noted that the structural and functional features discussed in reference to FIG. 5 can also be applied to other pixels (e.g., a pixel included in the second edge region ED2).

Most of the first incident light rays L1 incident upon a pixel through air having the lowest reflective index are directed to the microlens 200 at a boundary between the air and the microlens 200, and most of light rays having passed through the microlens 200 may be directed to the semiconductor region 400 at a boundary between the optical filter 300 and the semiconductor region 400.

In the following description, it is assumed that refraction and reflection of light do not occur in the boundary between the microlens 200 and the optical filter 300 for convenience of description.

Light rays having passed through the microlens 200 may be a first passing light (L1'), most of the light rays (e.g., about 95% of L1) are directed to the semiconductor region 400 at the boundary between the optical filter 300 and the semiconductor region 400, but other light rays (e.g., about 5% of L1) may be a first reflection light ray (L1*r*) that is reflected back into the optical filter 300 and the microlens 200 at the boundary (or a top surface of the semiconductor region 400) between the optical filter 300 and the semiconductor region 400.

The reflective structure 500 may reflect the first reflection light ray (L1*r*) toward the semiconductor region 400, so that the reflected light can be reflected as a second incident light ray L2. The second incident light ray L2 may be incident upon the boundary between the optical filter 300 and the semiconductor region 400 after passing through the microlens 200 and the optical filter 300.

The second incident light ray L2 may become a second passing light ray (L2'), most of the light rays (e.g., about 95% of L2, namely, about 4.75% of L1) are directed to the semiconductor region 400 at the boundary between the optical filter 300 and the semiconductor region 400, but other light rays (e.g., about 5% of L2, namely, about 0.25% of L1) may be a second reflection light ray (L2*r*) that is reflected to the outside of the pixel in a direction from one boundary between the optical filter 300 and the semiconductor region 400 toward the optical filter 300 and the microlens 200.

In the above example, when the reflective structure 500 is not included in the pixel, the ratio of light rays (L1') directed to the semiconductor region 400 with respect to the first incident light rays L1 may be about 95%.

On the other hand, when the reflective structure 500 is included in the pixel, the ratio of the light rays (L1'+L2') directed to the semiconductor region 400 with respect to the first incident light rays (L1) may be about 99.75%.

Thus, when the reflective structure 500 is included in the pixel, as the amount of light rays directed to the semiconductor region 400 relatively increases, the light reception (Rx) efficiency of the corresponding pixel may also increase.

Figure 6:
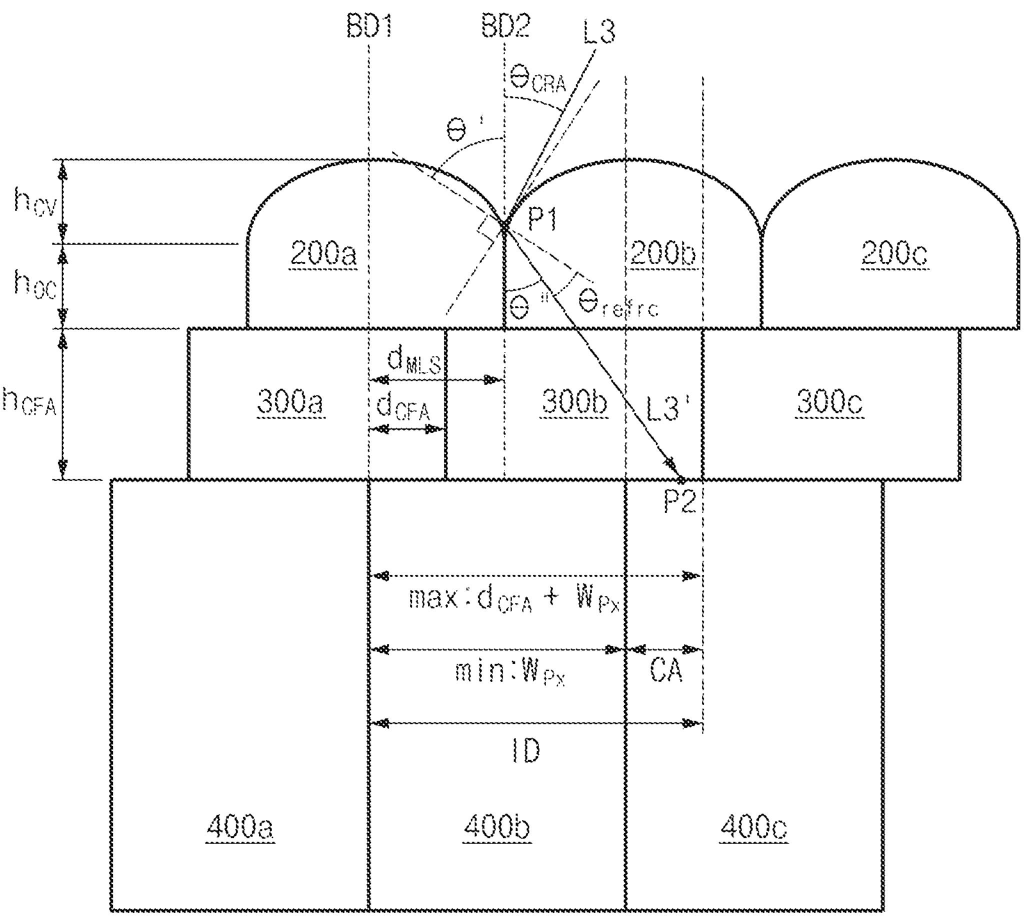
FIG. 6 is a diagram illustrating an example pixel structure that that includes a reflective structure shown in FIG. 4 to reduce optical crosstalk.
Figure 7:
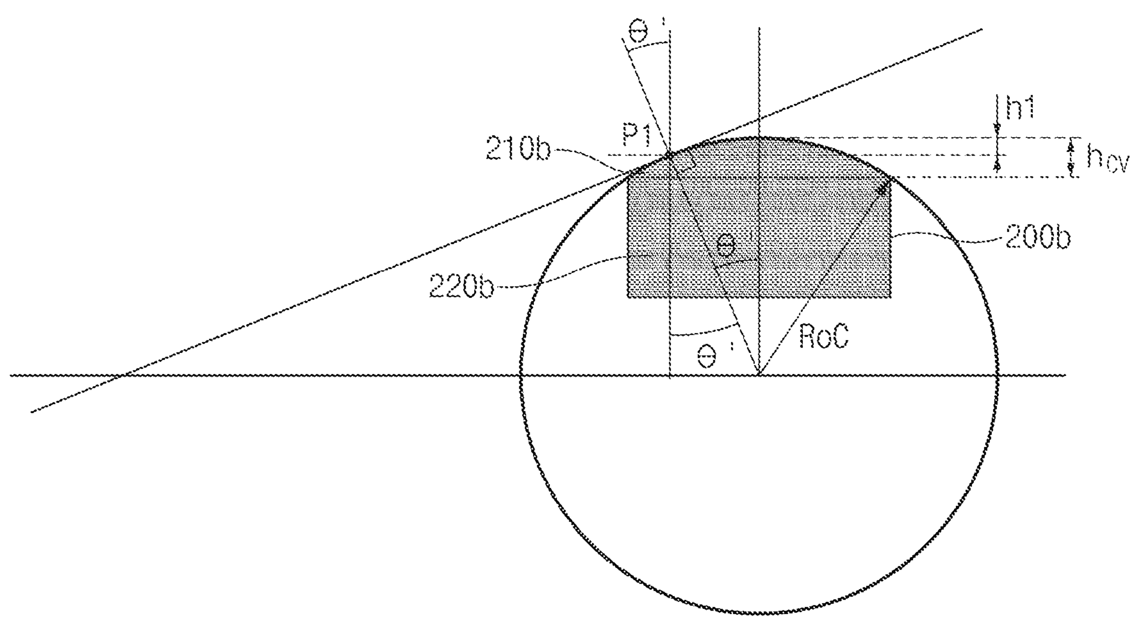
FIG. 7 is a diagram illustrating an example method for calculating a first calculation angle.

FIG. 6 is a diagram illustrating an example pixel structure that that includes a reflective structure shown in FIG. 4 to reduce optical crosstalk. FIG. 7 is a diagram illustrating an example method for calculating a first calculation angle.

Referring to FIG. 6, first to third pixels adjacent to each other in the first edge region ED1 are illustrated, and it is assumed that a third incident light ray L3 corresponding to the chief ray CR is incident upon the second pixel for convenience of description. Although the schematic diagram in FIG. 6 mainly illustrates the second pixel for convenience of description, it should be noted that the structural and functional features discussed in reference to FIG. 6 can also be applied to other pixels (e.g., the first or third pixel, and a pixel included in the second edge region ED2).

The first pixel may include a microlens 200*a*, an optical filter 300*a*, and a semiconductor region 400*a*, the second pixel may include a microlens 200*b*, an optical filter 300*b*, and a semiconductor region 400*b*, and the third pixel may include a microlens 200*c*, an optical filter 300*c*, and a semiconductor region 400*c*. It is assumed that the first to third pixels are substantially identical in structure to each other.

In each of the first to third pixels, each of the microlens and the optical filter may be shifted by a predetermined distance toward the optical axis OA with respect to the semiconductor region. For example, in the second pixel, the microlens 200*b* of the second pixel may be shifted by a first shift distance ($d_{MLS}$) from a first boundary BD1 between the semiconductor region 400*a* of the first pixel and the semiconductor region 400*b* of the second pixel, and the optical filter 300*b* of the second pixel may be shifted by a second shift distance ($d_{CFA}$) from the first boundary BD1 between the semiconductor region 400*a* of the first pixel and the semiconductor region 400*b* of the second pixel.

The third incident light ray L3 may be incident upon the first point P1 of the microlens 200*b* at a chief ray incident angle ($\theta_{CRA}$) indicating the angle of incidence of the chief ray CR. In this case, the first point P1 may refer to a certain position adjacent to the boundary between the microlens 200*a* and the other microlens 200*b*.

The third incident light ray L3 passing through the first point P1 may be refracted at a chief-ray refraction angle ($\theta_{refrc}$) due to a difference in the refractive index between the air and the microlens 200*b*, so that the refracted light may be directed toward the optical filter 300*b* as a third refraction light ray (L3').

When viewed from the first point P1 of the microlens 200*b*, the third incident light ray L3 may be incident upon the microlens at a lens incident angle ($\theta_{inc}$) corresponding to the sum of the chief ray incident angle ($\theta_{CRA}$) and the first calculation angle (θ'). When viewed from the second boundary BD2 between the microlens 200*a* of the first pixel and the microlens 200*b* of the second pixel, the angle between the second boundary BD2 and the third incident light ray L3 may be the chief ray incident angle ($\theta_{CRA}$), and the angle between the second boundary BD2 and a normal line of the first point P1 may correspond to a first calculation angle (θ'). In one example, the angle between the second boundary BD2 and a third refraction light ray (L3') may be defined as a second calculation angle (θ").

The microlens 200*b* may include a curved region 210*b* (see FIG. 7) formed in a convex shape with a predetermined radius of curvature, and an over-coating region 220*b* (see FIG. 7) disposed below the curved region and in contact with the optical filter 300*b*. The height of the curved region may be defined as a first height ($h_{CV}$), and the height of the over-coating region may be defined as a second height ($h_{OC}$). In addition, the height of the optical filter 300*b* may be defined as a third height ($h_{CFA}$).

The third incident light ray L3 may be refracted while passing through the first point P1, and may thus proceed as a third refraction light ray (L3'), so that the third refraction light (L3') can be incident upon the second point P2 of the semiconductor region 400*b* or 400*c*.

The distance between the first boundary BD1 and the second point P2 may be defined as the incident distance ID. In this case, the incident distance ID can be calculated by the following equation 1.

$$ID = (d_{NLS}) = (h_{sc} + h_{CFA}) \times \tan\theta'' \quad \text{[Equation 1]}$$

On the other hand, the chief ray refraction angle ($\theta_{refrc}$) may be represented by the following equation 2 using the chief ray incident angle ($\theta_{CRA}$) and the first calculation angle (θ').

$$\theta_{refrc} = \sin^{-1}\left(\frac{n_1}{n_2}\sin\theta_{inc}\right) = \sin^{-1}\left(\frac{n_1}{n_2}\sin(\theta_{CRA} + \theta')\right) \quad \text{[Equation 2]}$$

In Equation 2, 'n1' denotes a refractive index of the air, and 'n2' denotes a refractive index of the microlens 200*b*, and the second calculation angle (θ") can be calculated using Equation 2, as represented by the following equation 3.

$$\theta'' = \theta' - \theta_{refrc} \quad \text{[Equation 3]}$$

In Equation 3, the second calculation angle (θ") may be an angle that is determined by the chief ray incident angle ($\theta_{CRA}$) and the first calculation angle (θ'). In addition, the first calculation angle (θ') may be an angle that is determined by the position of the first point (P1).

Referring to FIG. 7, the microlens 200*b* and the first point P1 are illustrated, and the curved region of the microlens 200*b* may include an arc shape having a specific radius of curvature (RoC). As illustrated in FIG. 7, the first calculation angle (θ') may be identical to an angle between a normal line of the first point P1 and the straight line passing through the center of the circle and the center of the arc.

The first calculation angle (θ') can be calculated using the angle between the normal line of the first point P1 and the straight line passing through the center of the circle and the center of the arc, as represented by the following equation 4.

$$\theta' = \cos^{-1}\frac{RoC - h1}{RoC} \quad \text{[Equation 4]}$$

In Equation 4, 'h1' denotes the height from the uppermost height of the microlens 200*b* to the first point P1.

If 'h1' is set to zero '0', the first calculation angle (θ') may correspond to a minimum value (i.e., zero). If 'h1' is set to a first height ($h_{CV}$), the first calculation angle (θ') may correspond to a maximum value $$\cos^{-1}\frac{RoC - h_{CV}}{RoC}.$$

Referring back to FIG. 6, the third incident light ray L3 may be a light ray that causes optical crosstalk according to an incident distance ID. That is, at a top surface of the semiconductor region, a specific region in which the distance from the first boundary BD1 is longer than a pixel width (Wpx) and is shorter than the sum of the pixel width (Wpx) and the second shift distance ($d_{CFA}$) can be defined as a crosstalk region CA.

When the third incident light ray (L3) incident upon the microlens 200*b* of the second pixel is refracted so that the refracted light is incident upon the crosstalk region CA, the third refraction light ray (L3') may be directed to the semiconductor region 400*c* of the third pixel, causing optical crosstalk.

The condition for the third incident light ray L3 having the incident distance ID to cause optical crosstalk can be defined by the following equation 5.

$$w_{px} < ID < d_{CFA} + W_{px} \quad \text{[Equation 5]}$$

That is, the third incident light ray L3 having the incident distance ID satisfying Equation 5 may be incident upon the first point P1 of the second pixel, and may be incident upon the second point P2 of the third pixel, causing optical crosstalk.

However, when the reflective structure 500 is included in the pixel and disposed at the first point P1, the third incident light ray L3 causing optical crosstalk can be reflected to the outside of the corresponding pixel without being incident upon the second pixel, thereby reducing the optical crosstalk between pixels.

In other words, in a situation where the chief ray L3 for the corresponding pixel (e.g., the second pixel) is incident upon the microlens 200*b*, the reflective structure 500 may be disposed at a specific point where the refraction light ray (L3') formed by refraction of the chief ray L3 can be directed to another pixel (e.g., the third pixel) adjacent to the corresponding pixel.

Figure 8:
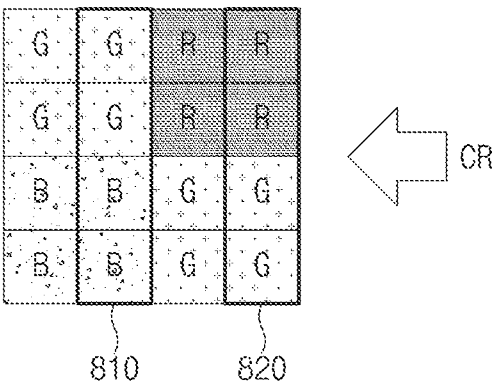
FIG. 8 is a diagram illustrating an example pixel array that includes pixels disposed in a first edge region.

FIG. 8 is a diagram illustrating an example pixel array 800 that includes pixels disposed in the first edge region ED1.

Referring to FIG. 8, the pixel array 800 disposed in the first edge region ED1 may include a plurality of pixels corresponding to a quad Bayer pattern arranged in a (4×4) matrix. That is, two green pixel groups each having a (2×2) matrix, one blue pixel group formed in a (2×2) matrix, and one red pixel group formed in a (2×2) matrix may form a Bayer pattern. Although FIG. 8 illustrates the pixel array 800 disposed in the first edge region ED1 as an example, other implementations are also possible, and it should be noted that the substantially same description as those of FIG. 8 can also be applied to other pixels disposed in the second edge region ED2.

As can be seen from FIG. 6, when the chief ray CR is incident upon the right side of the first edge region ED1, the chief ray CR having penetrated the microlens included in each pixel belonging to a specific column can be incident upon the semiconductor region included in each pixel belonging to an adjacent column located to the right side of the specific column, causing optical crosstalk.

In some implementations, although there is a low possibility that the optical crosstalk between pixels corresponding to the same color causes a color mixture, there is a high possibility that the optical crosstalk between pixels corresponding to different colors cause the color mixture, so that a serious noise may occur in the color information.

Accordingly, in some implementations, the reflective structure 500 should be included in each pixel arranged at a position relatively farther from the optical axis on the basis of the boundary between pixels corresponding to different colors.

In some implementations, the reflective structure 500 may not be disposed in all pixels included in the first edge region ED1. For example, the reflective structure 500 may be disposed only in the first pixel group 810 and the second pixel group 820, which are a set of pixels disposed relatively farther from the optical axis on the basis of the boundary between pixels corresponding to different colors. On the other hand, the reflective structure 500 may not be disposed in pixels disposed closer to the optical axis on the basis of the boundary between pixels corresponding to different colors.

That is, in the pixel array 800 in which pixels are arranged in a quad Bayer pattern as shown in FIG. 8, pixels each having the reflective structure 500 and other pixels each not having the reflective structure 500 may be alternately arranged in the traveling direction of the chief ray CR.

Figure 9:
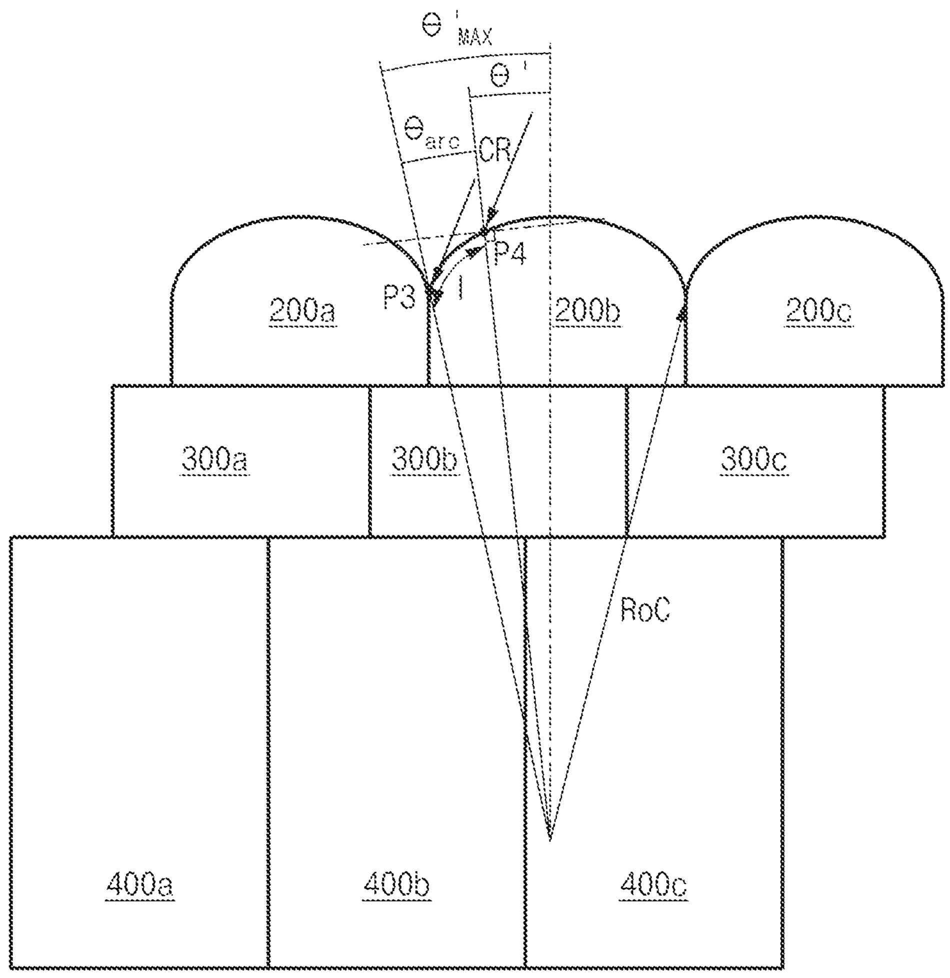
FIG. 9 is a diagram illustrating an example method for calculating the length of the reflective structure.

FIG. 9 is a diagram illustrating an example method for calculating the length of the reflective structure 500.

Referring to FIG. 9, the first to third pixels shown in FIG. 6 are illustrated. A method for calculating the length of the reflective structure (not shown) that can be disposed over the microlens 200*b* of the second pixel will hereinafter be described with reference to FIG. 9.

A third point P3 and a fourth point P4 may be predetermined on the top surface of the microlens 200*b*, and the reflective structure may be disposed between the third point P3 and the fourth point P4. As can be seen from FIG. 9, the third point P3 may be a specific point that overlaps with a boundary BD2 (see FIG. 6) between the microlens 200*a* and the other microlens 200*b*, but is not limited thereto.

A certain point located within the region between the third point P3 and the fourth point P4 may satisfy Equation 5. In other words, the region between the third point P3 and the fourth point P4 may satisfy Equation 5, so that the chief ray CR incident upon the region between the third point P3 and the fourth point P4 may be incident upon the semiconductor region 400*c* of the third pixel after passing through the microlens 200*b* and the optical filter 300*b* of the second pixel. Therefore, in order to prevent such an optical crosstalk, the reflective structure may be disposed to overlap with the region between the third point P3 and the fourth point P4.

In other implementations, the reflective structure may not be disposed in all regions formed to satisfy Equation 5. For example, if the region satisfying Equation 5 is excessively large in size, the reflective structure disposed in all regions satisfying Equation 5 may unnecessarily reduce the light reception (Rx) efficiency of the corresponding pixel. Alternatively, if the reflective structure is disposed in all regions satisfying Equation 5, the total amount of light rays received by the pixel array 110 may not be uniform. As a result, the reflective structure can be disposed in a region that is experimentally optimized in consideration of light reception (Rx) efficiency, optical crosstalk, and light uniformity.

The length (l) of the reflective structure can be calculated as shown in the following equation 6. The length (l) of the reflective structure may refer to the length of the arc of the microlens 200*b* that overlaps with the reflective structure.

$$l = RoC \times \theta_{arc} = RoC \times (\theta'_{MAX} - \theta') \quad \text{[Equation 6]}$$

That is, the length (l) of the reflective structure can be calculated as a product of the curvature radius (RoC) and the arc angle ($\theta_{arc}$). At this time, the arc angle ($\theta_{arc}$) may refer to an angle corresponding to an arc from the third point P3 to the fourth point P4.

The first calculation angle (θ') may refer to a first calculation angle for the fourth point P4, and a maximum first calculation angle (0'MAX) may refer to a maximum value of the first calculation angle (θ') shown in FIG. 7.

As the distance from the center (or the optical axis) of the pixel array 110 becomes longer (or as the distance to the outermost edge of the pixel array 110 becomes shorter), the length (l) of the reflective structure may gradually increase.

Figure 10:
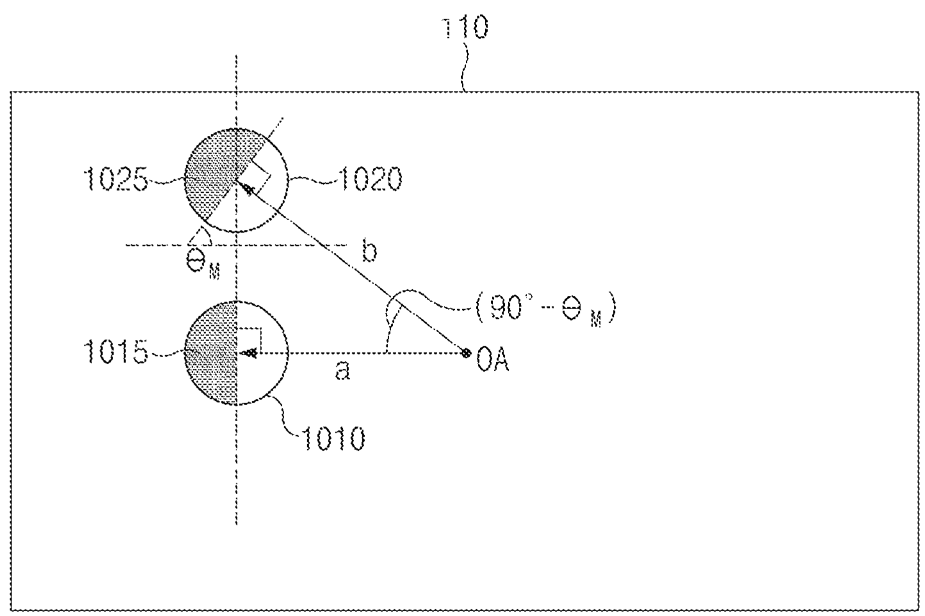
FIG. 10 is a diagram illustrating an example method for calculating a rotation angle of the reflective structure.

FIG. 10 is a diagram illustrating an example method for calculating a rotation angle of the reflective structure.

Referring to FIG. 10, a microlens 1010 of the pixel included in the first horizontal edge region HL and a microlens 1020 of the pixel included in the first diagonal edge region DLU are illustrated. The pixel including the microlens 1010 and the other pixel including the microlens 1020 may belong to the same column.

Although FIG. 10 illustrates the pixel included in the first diagonal edge region DLU as an example, other implementations are also possible, and it should be noted that the same description as those of FIG. 10 can also be applied to other pixels included in the second to fourth diagonal edge regions DRD, DLD, and DRU without change.

A reflective structure 1015 may be disposed over the microlens 1010, and a reflective structure 1025 may be disposed over the microlens 1020. In FIG. 10, it is assumed that the reflective structure 1015 is disposed to cover half of the microlens 1010 and the reflective structure 1025 is disposed to cover half of the microlens 1020.

Each of the reflective structure 1015 and the reflective structure 1025 may be formed to have a bow shape (a segment of a circular shape), a curved portion of the reflective structure 1015 and a curved portion of the reflective structure 1025 may be perpendicular to the chief ray. This is because each of the curved portion of the reflective structure 1015 and the curved portion of the reflective structure 1025 should be arranged perpendicular to the chief ray, so that the function (e.g., preventing optical crosstalk and increasing light reception (x) efficiency) of the reflective structure can be maximized. The chief ray may be emitted in the direction from the optical axis OA to the center of each of the microlenses 1010 and 1020.

Therefore, the curved portion of the reflective structure 1015 may have an angle of 90 degrees (90°) with respect to the horizontal line of the pixel array 110. In addition, the curved portion (i.e., chord) of the reflective structure 1025 may have a predetermined rotation angle ($\theta_M$) with respect to the horizontal line of the pixel array 110.

As shown in FIG. 10, the rotation angle ($\theta_M$) may be formed by subtracting, from 90°, an angle between the straight line through which the center of the microlens 1010 is connected to the optical axis OA and the other straight line through which the center of the microlens 1020 is connected to the optical axis OA. As a result, the rotation angle ($\theta_M$) can be calculated by the following equation 7.

$$\theta_M = 90° - \cos^{-1}\frac{a}{b} \quad \text{[Equation 7]}$$

In Equation 7, 'a' denotes the distance from the center of the microlens 1010 to the optical axis OA, and 'b' denotes the distance from the center of the microlens 1020 to the optical axis OA.

That is, the angle between the curved portion (i.e., chord) of the reflective structure disposed in a certain pixel and the horizontal line of the pixel array 100 may vary depending on the position of each pixel.

As is apparent from the above description, the image sensing device based on some implementations of the disclosed technology can improve light reception (Rx) efficiency of pixels, and can reduce crosstalk between pixels.

Although a number of illustrative embodiments have been described, it should be understood that various modifications and enhancements to the disclosed embodiments and other embodiments can be devised based on what is described and/or illustrated in this patent document.

What is claimed is:

1. An image sensing device comprising:

a lens module structured to converge incident light from a scene; and a pixel array located relative to the lens module to receive the converged incident light from the lens module and structured to include a plurality of pixels, each of which is structured to detect the converged incident light carrying image information of the scene, wherein the plurality of pixels in the pixel array includes a first pixel in an edge region of the pixel array, the edge region being spaced apart from an optical axis of the lens module by a predetermined distance, wherein the first pixel includes:

a semiconductor region including a photoelectric conversion element configured to generate photocharge corresponding to an intensity of the incident light detected at the first pixel;

a microlens disposed over the semiconductor region; and a reflective structure disposed to cover a portion of the first pixel, and wherein: the microlens includes a first microlens overlapping a first reflective structure and a second microlens overlapping a second reflective structure, the first microlens being disposed closer to an edge of the pixel array than the second microlens, the first reflective structure having a greater length than a length of the second reflective structure.

2. The image sensing device according to claim 1, wherein:

the microlens is disposed such that an optical axis of the microlens is shifted from a center of the semiconductor region toward the optical axis of the lens module.

3. The image sensing device according to claim 1, wherein:

the reflective structure is structured to reflect light rays reflected from a top surface of the semiconductor region toward the semiconductor region.

4. The image sensing device according to claim 1, wherein:

the reflective structure is structured to reflect light rays incident upon a top surface of the reflective structure to outside of the first pixel.

5. The image sensing device according to claim 1, wherein:

the reflective structure is disposed at a position where a chief ray for the first pixel that is incident upon the microlens is refracted toward another pixel adjacent to the first pixel.

6. The image sensing device according to claim 1, wherein:

the reflective structure is shifted from a center of the microlens in a direction away from the optical axis of the lens module and closer to an edge of the pixel array.

7. The image sensing device according to claim 1, wherein:

the reflective structure is formed to have a bow shape.

8. The image sensing device according to claim 7, wherein:

a curved portion of the reflective structure is perpendicular to a straight line connecting the optical axis of the lens module to a center axis of the microlens.

9. The image sensing device according to claim 1, wherein the first pixel further includes:

an optical filter disposed between the microlens and the semiconductor region.

10. The image sensing device according to claim 9, wherein:

a refractive index of the microlens is smaller than a refractive index of the optical filter; and a refractive index of the optical filter is smaller than a refractive index of the semiconductor region.

11. The image sensing device according to claim 1, wherein:

the reflective structure includes at least one of silver (Ag) and aluminum (Al).

12. An image sensing device comprising:

a lens module structured to converge incident light from a scene; and a pixel array located relative to the lens module to receive the converged incident light from the lens module and structured to include a plurality of pixels, each of which is structured to detect the converged incident light carrying image information of the scene, wherein the plurality of pixels in the pixel array includes a first pixel in an edge region of the pixel array, the edge region being spaced apart from an optical axis of the lens module by a predetermined distance, wherein the first pixel includes:

a semiconductor region including a photoelectric conversion element configured to generate photocharge corresponding to an intensity of the incident light detected at the first pixel;

a microlens disposed over the semiconductor region; and a reflective structure disposed to cover a portion of the first pixel, and wherein:

the first pixel includes a pixel with a first color filter and another pixel that is adjacent to the pixel with the first color filter and includes a second color filter different from the first color filter, wherein the pixel with the first color filter is disposed at a position relatively farther from the optical axis of the lens module than the pixel with the second color filter, and wherein the pixel with the first color filter includes a reflective structure, and the pixel with the second color filter does not include a reflective structure.

13. The image sensing device according to claim 12, wherein:

the pixel including the reflective structure and the pixel not including the reflective structure are alternately disposed in a direction of a chief ray incident upon the edge region.

14. An image sensing device comprising:

a semiconductor region including a photoelectric conversion element structured to generate photocharges corresponding to an intensity of incident light;

a microlens disposed over the semiconductor region to direct incident light to the semiconductor region; and a reflective structure disposed to cover a first portion of the microlens, wherein a second portion of the microlens, symmetrically opposite the first portion relative to a center of the microlens, is not covered by the reflective structure.

15. The image sensing device according to claim 14, wherein:

the microlens is disposed such that an optical axis of the microlens is shifted from a center of the semiconductor region toward an optical axis of a lens module.

16. The image sensing device according to claim 15, wherein:

the reflective structure is shifted from the center of the microlens in a direction away from the optical axis of the lens module and closer to an edge of a pixel array.

17. The image sensing device according to claim 14, wherein:

the reflective structure is structured to reflect light rays reflected from a top surface of the semiconductor region toward the semiconductor region.

18. The image sensing device according to claim 14, wherein:

the reflective structure is structured to reflect light rays incident upon a top surface of the reflective structure to outside of the semiconductor region.

19. The image sensing device according to claim 14, wherein the first portion of the microlens covered by the reflective structure includes a surface area of the microlens between an edge and the center of the microlens.

* * * * *